(12) United States Patent
Kachelmeier

(10) Patent No.: US 6,707,112 B2
(45) Date of Patent: Mar. 16, 2004

(54) MOS TRANSISTOR WITH RAMPED GATE OXIDE THICKNESS

(75) Inventor: Mark T. Kachelmeier, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/160,101

(22) Filed: Jun. 4, 2002

(65) Prior Publication Data

US 2002/0145166 A1 Oct. 10, 2002

Related U.S. Application Data

(60) Continuation of application No. 08/978,646, filed on Nov. 26, 1997, now abandoned, which is a division of application No. 08/768,883, filed on Dec. 17, 1996, now Pat. No. 5,741,737, which is a division of application No. 08/671,480, filed on Jun. 27, 1996, now abandoned.

(51) Int. Cl.[7] .................. H01L 29/76; H01L 29/94; H01L 31/062; H01L 31/113; H01L 27/14
(52) U.S. Cl. ....................... 257/368; 257/411
(58) Field of Search ................ 257/382–414, 257/350–351, 368–374; 438/300–305

(56) References Cited

U.S. PATENT DOCUMENTS

| | | |
|---|---|---|
| 3,719,866 A | 3/1973 | Naber et al. |
| 3,877,055 A | 4/1975 | Fisher et al. |
| 4,611,308 A | 9/1986 | Lonky |
| 4,642,881 A | 2/1987 | Matsukawa et al. |
| 5,101,257 A | 3/1992 | Hayden et al. |
| 5,164,805 A | 11/1992 | Lee |
| 5,175,599 A | 12/1992 | Yoshida |
| 5,217,923 A | 6/1993 | Suguro |
| 5,284,786 A | 2/1994 | Sethi |
| 5,323,039 A | 6/1994 | Asano et al. |
| 5,357,126 A | 10/1994 | Jimenez |
| 5,376,562 A | 12/1994 | Fitch et al. |
| 5,397,909 A | 3/1995 | Moslehi |
| 5,422,505 A | 6/1995 | Shirai |
| 5,428,240 A | 6/1995 | Lur |
| 5,436,482 A | 7/1995 | Ogoh |
| 5,502,321 A | 3/1996 | Matsushita |
| 5,516,717 A | 5/1996 | Hsu |

*Primary Examiner*—Cuong Nguyen
(74) *Attorney, Agent, or Firm*—Oblon, Spivak, McClelland, Maier & Neustadt, P.C.

(57) ABSTRACT

The invention relates to a transistor having a ramped gate oxide thickness, a semiconductor device containing the same and a method for making a transistor.

21 Claims, 2 Drawing Sheets

MOS TRANSISTOR WITH RAMPED GATE OXIDE THICKNESS

This application is a continuation of Ser. No. 08/978,646 filed Nov. 26, 1997 abandoned, which is a division of Ser. No. 08/768,883 filed Dec. 17, 1996 now U.S. Pat. No. 5,741,737 which is a division of Ser. No. 08/671,480 filed Jun. 27, 1996 abandoned.

BACKGROUND OF THE INVENTION

1. Field of the Invention

The invention relates to a MOS transistor with a ramped gate oxide thickness, a semiconductor device comprising a MOS transistor and a method for making a MOS transistor.

2. Discussion of the Background

Field effect transistors based on a metal-oxide semiconductor structure have revolutionized integrated circuit technology. However, conventional MOS transistors having a uniform gate oxide thickness across the length of the channel may exhibit high electric fields at the drain edge. These high electric fields can damage the drain region, especially an n-doped drain region. One source of damage associated with high electric fields is high-energy electrons or holes (referred to as hot electrons or hot holes), which can enter the oxide where they can be trapped, resulting in "oxide charging". Over time, oxide charges will tend to gradually degrade the device performance, most notably by increasing the threshold voltage and decreasing the control of the gate on the drain current. Such damage can be fatal to the operation of a MOS device, and accordingly, a more reliable MOS device is sought.

SUMMARY OF THE INVENTION

Accordingly, one object of the invention is to provide a novel MOS transistor comprising (a) a substrate with a source region, a channel and a drain region, and (b) a gate comprising a gate material and a gate oxide having a source region edge and a drain region edge, wherein said gate oxide has a thickness greater at said drain region edge than at said source region edge.

Another embodiment of the present invention is directed to a circuit comprising the present MOS transistor.

Another embodiment of the present invention is directed to a method of making a transistor, having a gate oxide layer thicker at said drain region edge than at said source region edge.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The MOS transistor according to the present invention is similar to a conventional MOS transistor, except that the thickness of a gate oxide layer across the length of the channel is greater at the drain region edge than at the source region edge.

The ratio of the gate oxide thickness at the drain region edge to the gate oxide thickness at the source region edge is >1:1, preferably ≧1.1:1, more preferably ≧1.2:1, most preferably about 1.5:1. In further embodiments, this ratio ranges up to about 100:1, preferably up to about 40:1, more preferably up to about 10:1 and most preferably up to about 4:1.

Figure 2:
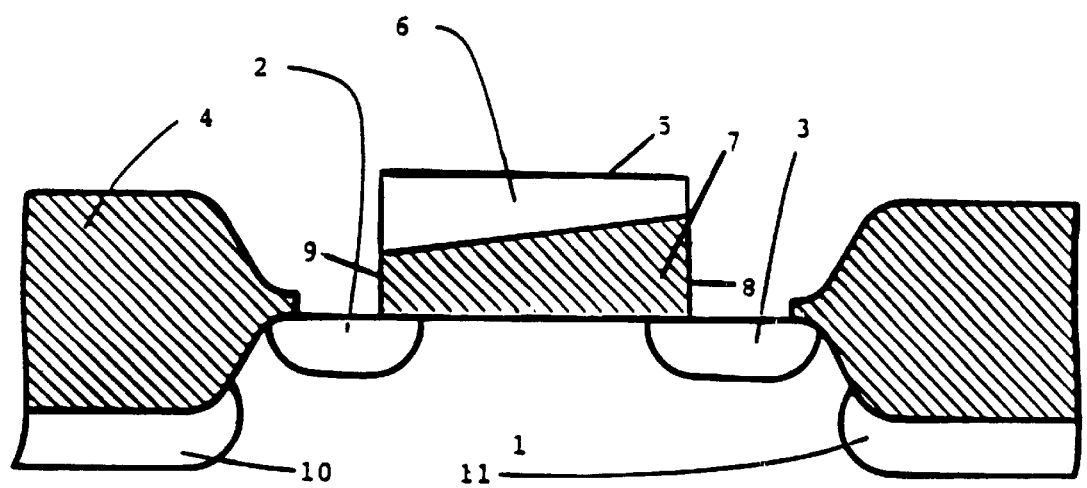
FIG. 2 shows a MOS transistor having a ramped or tapered gate oxide thickness.

Preferably, the thickness of the gate oxide continually increases from its source region edge to its drain region edge (i.e., in the direction from the source, across the channel, to the drain), such that at any point along the length of the channel, the gate oxide thickness on the side of the drain region ($t_d$) is ≧ the gate oxide thickness on the side of the source region ($t_s$), but at one or more such points, $t_d > t_s$. More preferably, the gate oxide thickness, beginning at the source region edge and moving to the drain region edge, across the length of the channel, will increase steadily in a ramped fashion as shown in FIG. 2. In other words, there is a gradual increase in the thickness of the gate oxide in the direction from the source region edge to the drain region edge.

Figure 1:
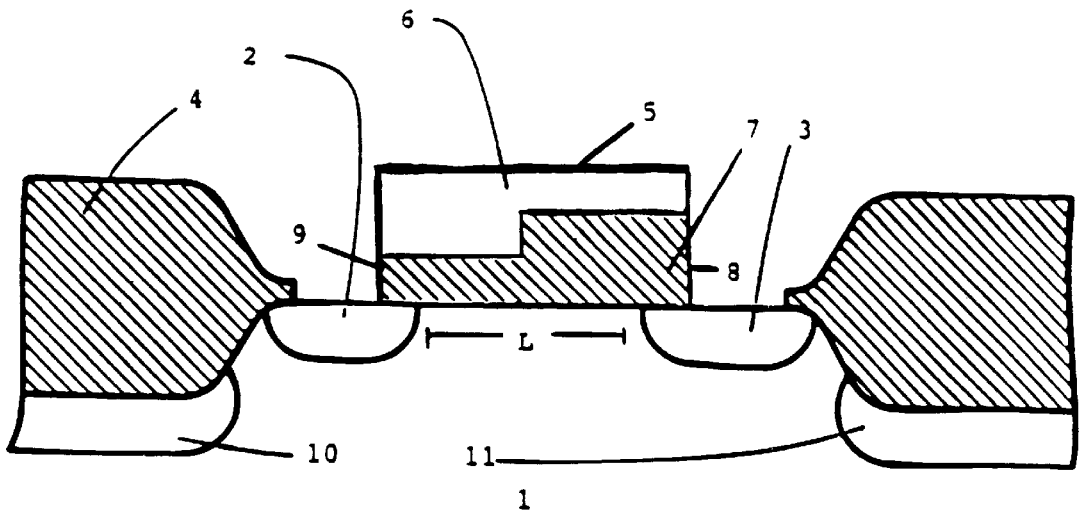
FIG. 1 shows one embodiment of a basic MOS transistor having a gate oxide thickness which is greater at the drain region edge than at the source region edge.
Figure 3:
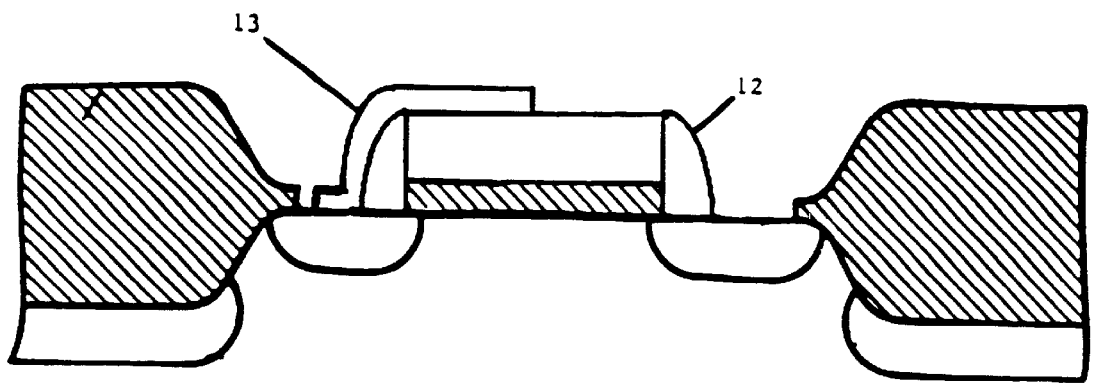
FIG. 3 illustrates a stage in the manufacture of a MOS transistor in which an oxidation mask is formed over a portion of the gate material, prior to oxidation.
Figure 4:
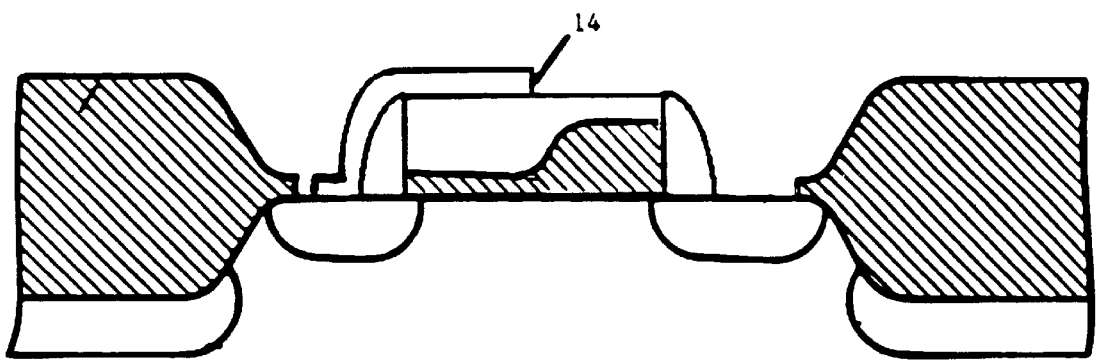
FIG. 4 illustrates a stage in the manufacture of a MOS transistor in which oxidation of the gate material in the presence of an oxidation mask has been performed.

Within the context of the present invention, FIGS. 1, 2 and 3 have been provided to illustrate certain aspects of the invention. The specific details of the composition of the gate material, gate oxide, semiconductor, source and drain regions are not limited by the Figures. In addition, the illustrations in FIG. 3 depicts the presence of lightly doped drain extensions and a sidewall oxide, the presence of either or both being optional to the practice of the claimed invention.

FIG. 1 depicts a basic MOS transistor having a ramped gate oxide thickness.

A substrate 1, having a source region 2, a drain region 3 and field oxide layer 4 is shown. A gate electrode 5, which comprises a gate material 6 and a gate oxide 7, is disposed over a channel between source region 2 and drain region 3. The gate oxide 7 has a drain region edge 8 and a source region edge 9. Optional channel stops 10 and 11 are illustrated. Additional elements such as contact electrodes and passivation layers have been omitted for clarity.

The absolute dimensions of the gate oxide thickness at the source side (i.e. the source region edge 9) are not particularly limited, and may vary depending on the desired characteristics of the device. Generally, the thickness of the gate oxide at the source region edge ranges from 50–1,000 Å.

The thickness of the gate oxide at the drain region edge 8 is not particularly limited, provided that the thickness at the drain region edge 8 is greater than the thickness at the source region edge 9. Preferably, the thickness at the drain region edge 8 is from 50–1,000 Å greater than the thickness at the source region edge 9.

The MOS transistor according to the present invention may be formed on any semiconductor substrate 1 conventionally known to those of ordinary skill in the art. Non-limiting examples of substrates 1 include silicon, gallium arsenide, silicon on sapphire (SOS), germanium, germanium silicon, diamond and silicon on insulator (SOI) material. Such substrates may be formed epitaxially in accordance with conventional techniques. Doping techniques known to those of ordinary skill in the art may be used to adjust the conductivity properties of the semiconductor substrate.

The gate oxide material 7 may be one conventionally known to those of ordinary skill in the art. Non-limiting examples include silicon dioxide, silicon oxynitride ($SiO_xN_y$), metal nitrides such as $Si_3N_4$, $V_2O_5$, tetraethylorthosilicate-based oxides and titanium oxide. Accordingly, the gate oxide material may not necessarily be an oxide, but simply functions as an insulation layer between the gate material and the substrate. The gate oxide material 7 may be modified by the addition of boron, phosphorous or both. $SiO_2$ and $SiO_2$-based films can be formed from thermal oxides; silane, tetraethoxysilane, borophosphosilicate glass and spin-on-glass. Preferably the gate oxide material 7 is an oxide of the corresponding gate material 6. More preferably, the gate oxide 7 is a silicon dioxide layer and the gate material 6 is polysilicon, which may be doped or undoped.

The gate material 6 may be any gate material conventionally known to those of ordinary skill in the art Non-limiting examples of gate materials include polysilicon, $WSi_x$, Al, W, Ti, Zr, Mo, and alloys thereof e.g. TiW alloy. In addition, the gate material may be a silicide such as $CoSi_2$, $HfSi_2$, $MoSi_2$, $NiSi_2$, $Pd_2Si$, PtSi, $TaSi_2$, $TiSi_2$, $WSi_2$, $ZrSi_2$ and $CrSi_2$.

The dimensions of the channel formed by the patterned gate material and gate oxide and the thickness of the gate material are not particularly limited and may vary depending on the desired performance of the device. Within the context of the present invention, the channel length (illustrated as L in FIG. 1) is the distance between the source and drain regions 2 and 3 and will typically be from 0.1 to 100 µm, preferably from 0.18 to 10 µm, more preferably from 0.25 to 2 µm. Typically the gate material will have a thickness (height) of from 0.1–10 µm. The gate material layer may have a different thickness at its drain region edge relative to its source region. The gate material layer thickness ($t_{GM}$) may be complementary to the gate oxide thickness ($t_{GO}$) as illustrated in FIGS. 1 and 2 such that after planarization, $t_{GO}+t_{GM}=$a Constant. However, the thickness of the gate material may be uniform across the interface with the gate oxide, such that the profile of the gate electrode 5 is thicker at the drain region side than at the source region side.

The channel will also have a width dimension, perpendicular to the plane of the page (the "X-Y" axes) as depicted in FIGS. 1 and 2. The width of the channel may vary depending on the desired electronic characteristics. Typically the channel width ranges from 0.1 to 2,000 µm, preferably from 0.1 to 1,000 µm, more preferably from 0.4 to 100 µm.

The doping of the semiconductor substrate to form source and drain regions 2 and 3 may be conducted by methods known to those of ordinary skill in the art, using materials known to those of ordinary skill in the art for their known purposes. For example, n-type and p-type doping of a semiconductor substrate (which may be light or heavy) may accomplished by conventional methods known to those of ordinary skill in the art. Dopant species such as arsenic, phosphorus, and boron may be added by well known techniques such as ion implantation or diffusion. Implantation may be followed by annealing and/or "drive-in" steps to deliver the dopant in a desired fashion. Such annealing and drive-in steps may be conducted by conventional methods known to those of ordinary skill in the art. The locations of the source and drain regions may be self-aligned with the gate material.

The device may also be equipped with lightly doped extensions at the source, the drain or both (also known as "lightly doped diffusions" or LDD's). The formation of such lightly doped drain and source extensions are conventional and known to those of skill in the art (see for example U.S. Pat. No. 4,356,623, incorporated herewith by reference). When doped extensions are incorporated into the device, a sidewall oxide may be added to the wall of the patterned gate material. The side wall oxide and gate material act to align the highly doped regions of the source and the drain to the gate electrode.

The device may also be equipped with a protection layer, such as a glass layer (e.g., silicate glass, phosphosilicate glass, borophosphosilicate glass, $SiO_xN_y$, etc.). A protective layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

The present transistor may also be equipped with contacts (e.g. electrical contacts) to the source, drain and gate material, which may be formed by conventional methods known to those of ordinary skill in the art. Examples of suitable contact materials include metals such as aluminum, titanium, zirconium, chromium, molybdenum, tungsten or alloys thereof (e.g., TiW). When the contact is aluminum, alloying of the aluminum with silicon may be conducted to reduce dissolution of source and drain silicon into the aluminum.

The device may also be equipped with one or more passivation layer(s) as desired and/or necessary, comprising a dielectric material such as a silicate (silicon dioxide, tetraethylorthosilicate based oxides, etc., phosphosilicate (phosphate-silicate-glass), borophosphosilicate glass (borophosphate-silicate glass), borosilicate-glass, oxidenitride-oxide glass, tantalum pentoxide, plasma etched silicon nitride, titanium oxide, silicon oxynitrides etc. Bonding contact masks may be used to expose bonding pads for bonding during assembly. The methods for forming of such passivation layers and bonding pads is conventional and known to those of ordinary skill in the art.

The present transistor (or device) may be incorporated into a semi-conductor device such as an integrated circuit (e.g., a memory cell such as an SRAM, a DRAM, an EPROM, an $E^2$PROM etc;, a programmable device; a data communications device; etc.). The present device offers advantages over a conventional uniform gate oxide device, including a lower electric field across the gate oxide at the drain region edge, lower stress on the gate oxide, lower overlap capacitance at the drain side and better device reliability.

The present MOS device having a gate oxide thickness at the drain region edge greater than at the source region edge may be formed by the following method.

A semiconductor substrate may be provided which comprises a semiconductor bulk layer, an initial oxidation layer, a field oxide and optionally, source and drain channel stops. A field oxide layer on the semiconductor substrate preferably has a thickness of about 2,000–8,000 Å, preferably 3,000–5,000 Å. Doping of the semiconductor bulk layer in order to adjust the conductivity characteristics of the bulk layer may be conducted by conventional methods known to those of ordinary skill in the art. Such a semiconductor substrate may be formed by conventional methods known to those of ordinary skill in the art, such as those methods described in Ruska, *Microelectronic Processing An Introduction to the Manufacture of Integrated Circuits*, McGraw-Hill Books, pp 375–382 (1987).

A gate material may be formed on the surface of the initial oxidation layer of the substrate in the region of the channel stops, by conventional methods known to those of ordinary skill in the art. Patterning of the gate material to form a gate in the region of the channel stops is conducted by conventional methods known to those of ordinary skill in the art, such as lithographic masking and etching techniques. (See for example Ruska, *Microelectronic Processing An Introduction to the Manufacture of Integrated Circuits*, McGraw-Hill Books, pp 375–382 (1987)).

Suitable gate materials are described above, such as polycrystalline silicon, which may be deposited by chemical vapor deposition and/or plasma vapor deposition techniques at a temperature of from 400° to 800°, preferably about 600° C. Doping of the polycrystalline silicon may be performed in accordance with known methods to adjust the conductivity of the gate material.

An optional sidewall oxide space layer (illustrated as 12 in FIG. 3), such as that used for the formation of lightly doped extensions, may be formed along the edges of the gate material by conventional methods known to those of ordinary skill in the art. The oxide spacer is formed on at least the side walls of the source and drain region edges of the patterned gate material, and may completely surround the gate material. The sidewall oxide material is preferably suficiently permeable to oxygen, to allow for lateral oxidation of the gate material under the oxidation conditions. Examples of oxide spacer materials include silicon dioxide and/or any other oxide mentioned above, $SiO_2$ being preferred.

A mask (illustrated as 13 in FIG. 3) may be deposited to prevent oxidation of covered material. In the present invention, a mask may be selectively deposited on or over at least the source region edge of the gate, leaving a region of the gate material at the drain region edge exposed. A mask may be formed by conventional deposition and etching techniques, known to those of ordinary skill in the art such as direct patterning or photolithography.

For example, conventional lithographic and etching techniques may be used to form desired patterns of a mask, especially the use of photolithographic techniques on a polymer layer photoresist. The use of either positive or negative resist materials may be used. Positive and negative resists, and methods of making the same and using the same to form a mask, are conventional and known to those of ordinary skill in the art.

Etching of deposited films may be conducted by conventional methods known to those of ordinary skill in the art. The specific etching material depends on the material being removed, the resist material and the compatibility of the etching material with the existing structure. Selection of suitable etching materials, resist materials and etching conditions is within the level of skill of those of ordinary skill in the art.

The mask is formed, wherein a region of the gate over the transistor drain region is exposed and a region of the gate over the transistor source region is covered. A masked gate region is illustrated in FIG. 3. In FIG. 3, an initial oxidation layer is depicted below the gate material across the length of the channel.

Mask materials for use in the present invention include those known to those of ordinary skill in the art. Such mask materials may act as a barrier to oxidation. Suitable masks may include a metal nitride layer, such as $Si_3N_4$, or silicon. $Si_3N_4$ layers may be formed by conventional methods known to those of ordinary skill in the art, such as by chemical vapor deposition techniques. The thickness of the mask may be that sufficient to inhibit oxidation of the material covered by the mask. In the case of a $Si_3N_4$ mask, a layer of 75–150 Å in thickness may be used to aid later implantation. Alternatively, the mask layer thickness may be up to 2,500 Å if implantation is not a concern.

In addition, the mask is deposited so as to inhibit lateral oxidation of the gate material at the source region edge. Accordingly, when sidewall oxide spacers are present, the mask preferably covers the sidewall oxide space on the side adjacent to the source region edge.

Doping of the source and drain regions may be conducted by conventional methods known to those of ordinary skill in the art.

Lightly doped extensions may be provided at both the source and drain, by conventional methods known to those of ordinary skill in the art. When incorporated, the lightly doped extensions are formed before a sidewall oxide is deposited, but after the preparation of the patterned gate material.

The substrate having a mask covering the surface of the gate material closest to the transistor source region and not covering the surface of the gate material closest to the transistor drain region is then oxidized (e.g., subjected to selective oxidation conditions), such that the gate material closest to the transistor drain region is converted to a corresponding oxide but the gate material closest to the transistor source region is not substantially converted to the corresponding oxide. Oxidation may be conducted by conventional methods known to those of ordinary skill in the art, such as those used for "localized oxidation of silicon" (LOCOS). Oxidation conditions may include steam oxidation at a temperature of about 700–1100° C., preferably 700–1000° C., more preferably 700–900° C. Adjustment of the pressure of oxidation, the density of the oxidant gas and the time of oxidation may be adjusted as conventionally known in the art to result in the desired amount of oxidation of the gate material.

Steam oxidation results in selective oxidation of the gate material in the region not covered by the mask. Since the gate material at the source region edge is masked with a material which inhibits diffusive oxidation, while the gate material at the drain region is not masked, non-uniform oxidation of the gate material occurs, producing a gate oxide layer having a thickness at its drain region edge greater than at its source region edge.

In addition, oxidation of the gate material produces an increase in the volume of the gate oxide, as compared to the volume of the non oxidized gate material, contributing further the difference in thickness between the drain region edge and the source region edge. The phenomenon of lateral encroachment during oxidation and the gradual transition between oxidized and non-oxidized regions has been reported during the formation of field oxide during "localized oxidation of silicon" (LOCOS) and has been referred to as resulting in a "bird's beak". A illustration of the "birds' beak" is provided in FIG. 4. The proportion of the gate oxide thickness, relative to the thickness of the gate material, as well as the position of the gate oxide relative to the mask edge 14 (see FIG. 4) is not necessarily drawn to scale. In FIGS. 1–4, a initial oxidation layer is illustrated as having been removed from the source and drain regions. The removal of such an initial oxidation layer may be conducted by conventional methods known to those of ordinary skill in the art. However, it will be appreciated that, within the context of the present invention, the initial oxidation layer may be present over the source and drain regions.

In addition, oxidation may be a diffusion-controlled process. Thus, the oxidizing agent(s) may encroach under the edge of the mask covering the source region, providing for formation of a gate oxide with a gradual change in its thickness along axis an perpendicular to the mask edge 14, the channel/source boundary and/or the channel/drain boundary.

The oxide formed from the gate material may be substantially similar to an initial oxidation layer such that when the initial oxidation layer and the oxidized gate material are of the same composition, there is no detectable interface between the initial oxidation layer and the gate oxide formed from the gate material. Thus, the present invention may be most suitable for complementary metal-oxide-semiconductor (CMOS) transistors.

After the oxidation of the gate material has been performed, the mask used to form the ramped gate oxide may be removed by conventional techniques known to those of ordinary skill in the art. However, it is within the scope of the present invention to leave the mask material in place and conduct further elaboration of the device.

After oxidation of the gate material to from a gate electrode with a ramped gate oxide, further elaboration of the MOS transistor may be conducted by conventional methods known to those of ordinary skill in the art. Planarization, formation of contacts to source, drain and gate and passivation may be conducted by conventional methods.

In addition, local interconnects may be formed to conductively connect the source, drain and gate contacts to regions of an integrated circuit. Conventional electrode connectors and/or metal contacts may be added, inserted and/or placed into a semiconductor device containing the present transistor by conventional methods known to those of ordinary skill in the art.

The configuration of the present transistor and/or MOS device is applicable to NMOS, PMOS and CMOS transistors. Substrate doping to prepare NMOS, PMOS and CMOS transistors is conventional and known to those of ordinary skill in the art. In an NMOS devise, the substrate is a p-type material and the source and drain are of n-type materials. In a PMOS device, the substrate is an n-type material and the source and drain are p-type materials. A CMOS device comprises both n- and p-channel transistors. The gate of either the n-channel, the p-channel or both may have a ramped gate oxide thickness. Preferably, at least the transistor having an n-type drain region has a ramped gate oxide thickness.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A transistor comprising:
   a) a semiconductor substrate;
   b) a source region;
   c) a drain region;
   d) a gate connecting said source region and said drain region, said gate comprising a gate material layer and a gate oxide layer having a source region edge and a drain region edge, and
   e) an oxidation mask overlying said source region edge and a surface of said gate material closest to said source region, said oxidation mask not covering said drain region edge,
   wherein said gate oxide layer has a thickness at the drain region edge greater than at the source region edge.

2. The transistor of claim 1, wherein a drain region edge thickness and said source region edge thickness are in a ratio of >1:1 and ≦100:1.

3. The transistor of claim 2, wherein said ratio is ≧1.1:1.

4. The transistor of claim 1, wherein said source region edge has a thickness of from 50 to 1,000 Å.

5. The transistor of claim 1, wherein said gate oxide thickness from said source region edge to said drain region edge does not decrease, such that at any point along a length of a channel, the gate oxide thickness on the drain region side of said point is ≧ the gate oxide thickness on the source region side of said point.

6. The transistor of claim 1, wherein said substrate is selected from the group consisting of silicon, gallium arsenide, silicon on sapphire, germanium, germanium silicon, diamond and silicon on insulator material.

7. The transistor of claim 1, wherein said gate oxide layer is a material selected from the group consisting of silicon dioxide, a tetraethylorthosilicate-based oxide and titanium oxide.

8. The transistor of claim 1, wherein said gate material layer is a material selected from the group consisting of polysilicon, Al, W, Ti, Zr, Mo and alloys thereof.

9. The transistor of claim 1, further comprising a channel between said source region and said drain region having a length of from 0.1 to 100 μm.

10. The transistor of claim 1, wherein said gate material layer is polysilicon.

11. The transistor of claim 1, wherein said gate oxide layer is silicon dioxide.

12. The transistor of claim 1, further comprising lightly doped extensions on said source region and said drain region.

13. The transistor of claim 1, wherein said transistor is an n-channel MOS transistor.

14. The transistor of claim 1, wherein said transistor is a p-channel MOS transistor.

15. A semiconductor device comprising the transistor of claim 1.

16. The semiconductor device of claim 15, further comprising a MOS transistor, wherein said device is a CMOS device.

17. The transistor of claim 1, wherein said gate oxide in a region which does not underlie said oxidation mask is thicker than said gate oxide in a region which underlies said oxidation mask.

18. A transistor comprising:
   a) a semiconductor substrate;
   b) a source region;
   c) a drain region;
   d) a gate connecting said source region and said drain region, said gate comprising a gate material layer and a gate oxide layer having a source region edge and a drain region edge, and
   e) an oxidation mask overlying said source region edge and a surface of said gate material closest to said source region, said oxidation mask not covering a surface of said gate material closest to said drain region,
   wherein said gate oxide layer has a thickness at the drain region edge greater than at the source region edge.

19. The transistor of claim 1, wherein said gate oxide layer comprises a corresponding oxide of said gate material layer.

20. The transistor of claim 1, wherein there is no detectable interface in said gate oxide layer.

21. The transistor of claim 1, wherein said gate oxide layer comprises a corresponding oxide of said gate material layer and a material selected from the group consisting of silicon oxynitride and a metal nitride.

* * * * *